(12) United States Patent
Sanchez et al.

(10) Patent No.: US 9,111,984 B2
(45) Date of Patent: Aug. 18, 2015

(54) DEVICES AND METHODS OF OPERATION FOR SEPARATING SEMICONDUCTOR DIE FROM ADHESIVE TAPE

(71) Applicant: Freescale Semiconductor, Inc., Austin, TX (US)

(72) Inventors: Audel A. Sanchez, Tempe, AZ (US); David F. Abdo, Scottsdale, AZ (US); Michael L. Eleff, Phoenix, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 102 days.

(21) Appl. No.: 14/064,422

(22) Filed: Oct. 28, 2013

(65) Prior Publication Data

US 2015/0114572 A1     Apr. 30, 2015

(51) Int. Cl.
  *B32B 38/10* (2006.01)
  *H01L 21/683* (2006.01)
  *H01L 21/67* (2006.01)
  *B32B 43/00* (2006.01)

(52) U.S. Cl.
  CPC ...... *H01L 21/6836* (2013.01); *H01L 21/67132* (2013.01); *B32B 38/10* (2013.01); *B32B 43/006* (2013.01); *H01L 2221/68327* (2013.01); *H01L 2221/68386* (2013.01); *Y10T 156/1132* (2015.01); *Y10T 156/1944* (2015.01)

(58) Field of Classification Search
  CPC  B32B 38/10; B32B 43/006; Y10T 156/1132; Y10T 156/1944
  USPC .......................................... 156/785, 707, 716
  See application file for complete search history.

(56) References Cited

U.S. PATENT DOCUMENTS

| | | | |
|---|---|---|---|
| 4,667,402 A | 5/1987 | Wilde | |
| 4,859,269 A | 8/1989 | Nishiguchi | |
| 6,139,676 A * | 10/2000 | Fernandez | 156/765 |
| 6,889,427 B2 | 5/2005 | Yee et al. | |
| 7,238,258 B2 * | 7/2007 | Park et al. | 156/765 |
| 2006/0090846 A1 * | 5/2006 | Cheung et al. | 156/344 |
| 2007/0277929 A1 * | 12/2007 | Trinks et al. | 156/344 |
| 2011/0088845 A1 * | 4/2011 | Chong et al. | 156/344 |
| 2011/0297329 A1 * | 12/2011 | Canale et al. | 156/756 |
| 2012/0145332 A1 * | 6/2012 | Chien et al. | 156/758 |

* cited by examiner

*Primary Examiner* — Mark A Osele
*Assistant Examiner* — Nickolas Harm
(74) *Attorney, Agent, or Firm* — Ingrassia Fisher & Lorenz, P.C.

(57) ABSTRACT

The embodiments described herein provide an apparatus and method for separating dies from adhesive tape. In general, these techniques use applied vacuum and one or more channels in an extractor base surface to progressively peel adhesive tape away from the die. When the adhesive tape has been peeled away from the entire die the die can be removed and packaged. Such a technique can reduce the strain the die and thus may reduce the probability of cracks occurring in the die, and is thus particularly applicable to removing adhesive tape from relatively thin dies.

17 Claims, 5 Drawing Sheets

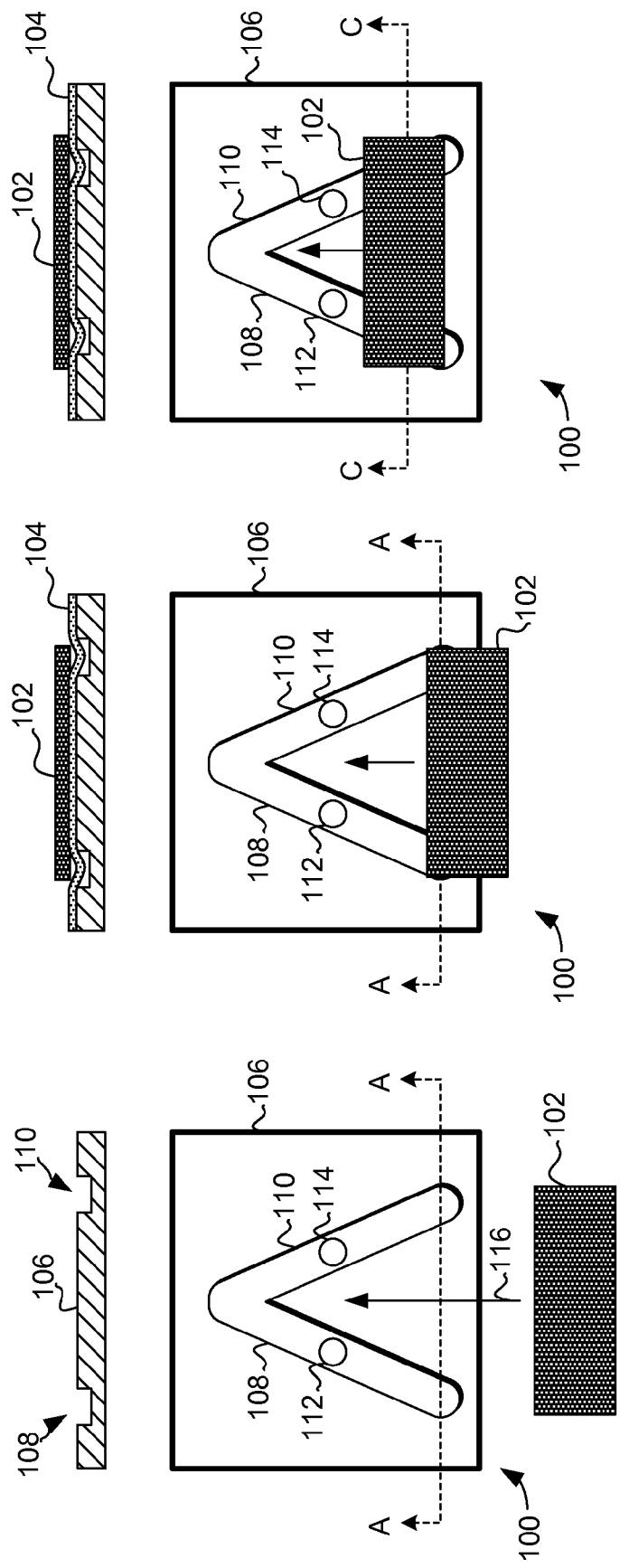

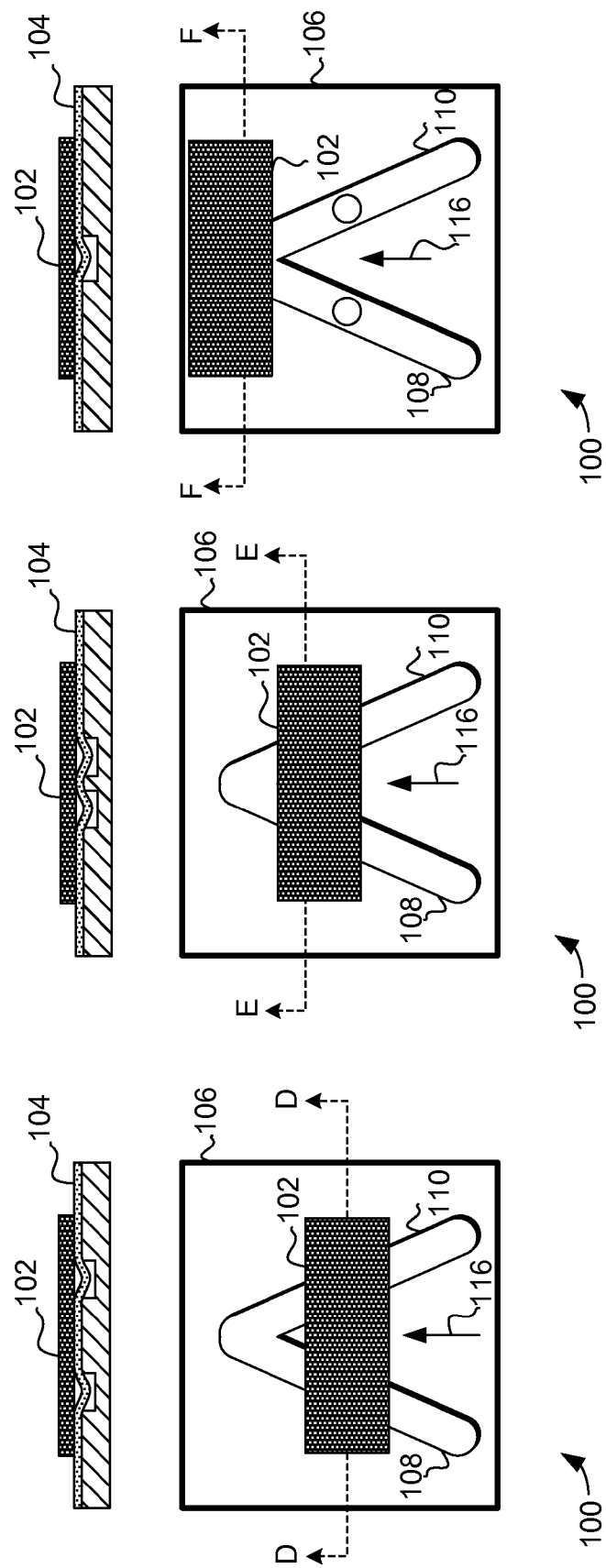

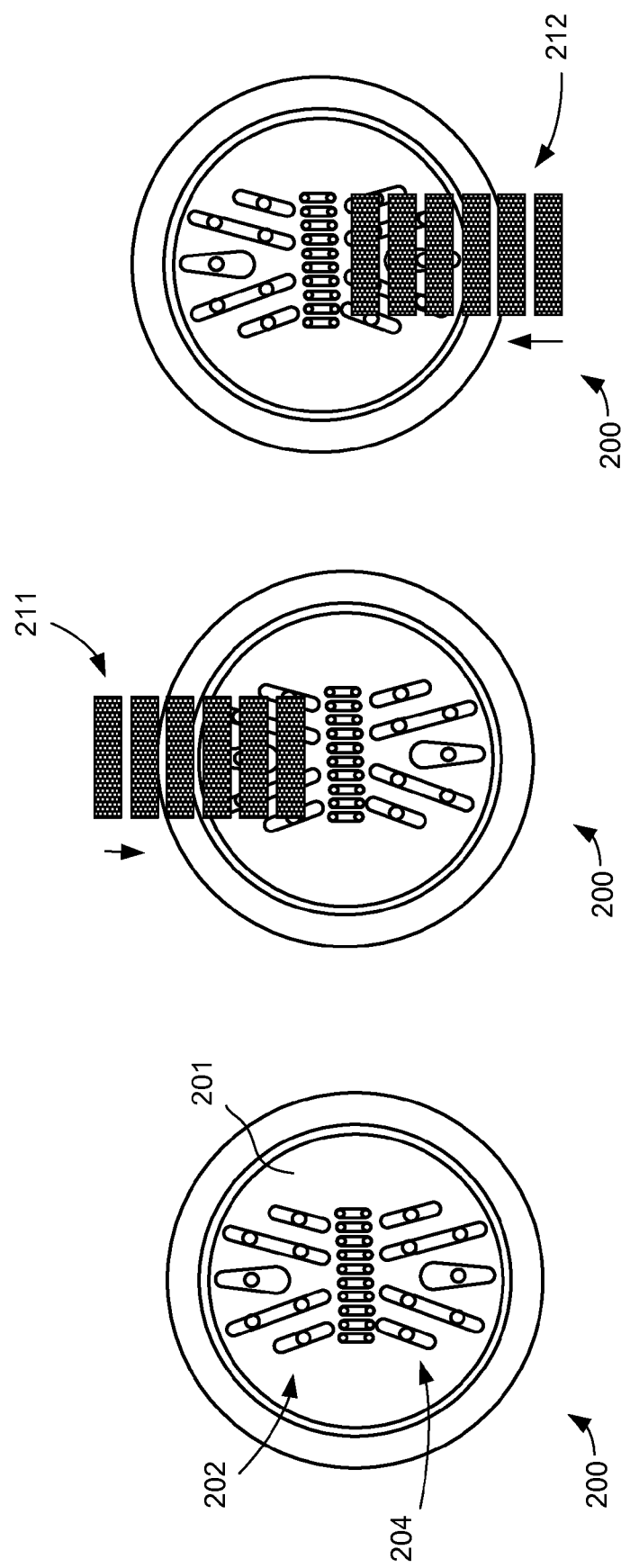

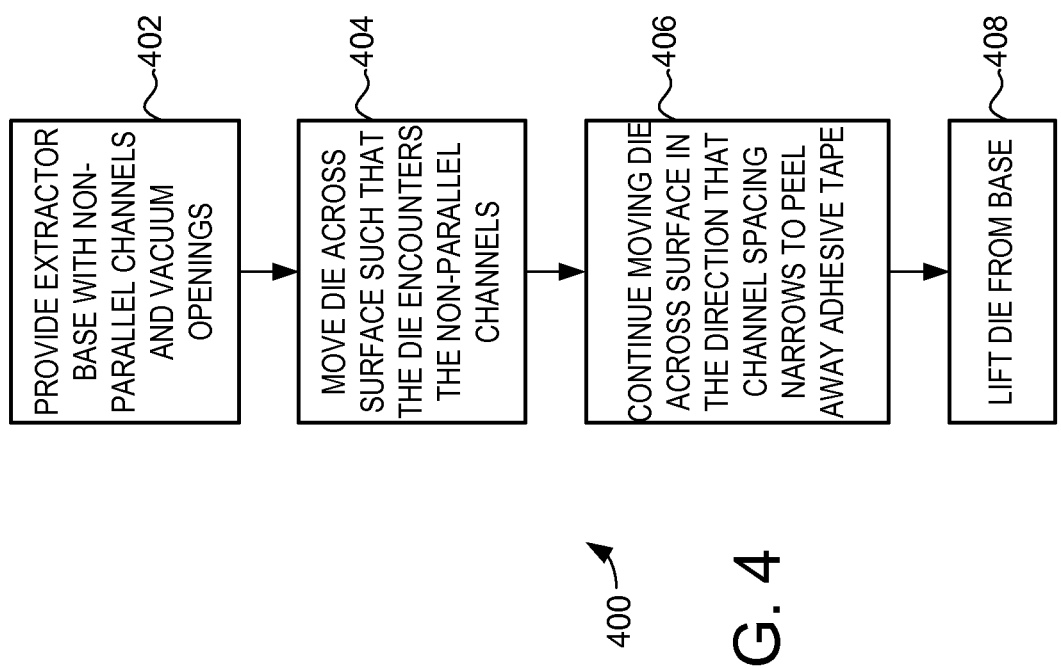

DEVICES AND METHODS OF OPERATION FOR SEPARATING SEMICONDUCTOR DIE FROM ADHESIVE TAPE

TECHNICAL FIELD

Embodiments of the subject matter described herein relate generally to semiconductor device fabrication and more specifically to separating semiconductor die from adhesive film.

BACKGROUND

Integrated circuits (ICs) are typically formed on a semiconductor wafer. The semiconductor wafer is then mounted on adhesive tape and the wafer is cut into individual dies using a wafer saw. In general, the adhesive tape provides support for the wafer during the die cutting operation. Typically the wafer saw cuts the wafer into separate die while not cutting through the adhesive tape. The dies are then individually separated from the adhesive tape for transfer to packaging.

A variety of techniques have been used to separate the dies from the adhesive tape. As one example, ejector pins (sometimes referred to as plunge-up needles) have been used to separate the dies. In these techniques the ejector pins are projected from a needle holder and push the die from underneath through openings in an anvil. This causes the die and the adhesive tape to disengage from one another. The separated die can then be picked up and transferred to a die transfer pack or the packaging substrate.

Such techniques have several disadvantages. For example, while the use of ejector pins can be effective for relatively thick dies, such techniques can be problematic when applied to thinner dies that are increasingly used for modern integrated circuits. Specifically, on thinner dies the use of ejector pins to separate the die from adhesive tape can result various types of die cracks. Such die cracks can result in lower yield for final packaged devices and/or lower long term reliability.

For this reason there is a continuing need for improved devices and techniques for separating semiconductor die from adhesive tape.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 1A-1F are top and cross-sectional views of a die extractor base in accordance with an example embodiment;

FIGS. 3A, 3B and 3C are top views of a die extractor base in accordance with an example embodiment; and FIG. 4 is a flow diagram of a die separation method in accordance with another example embodiment.

DETAILED DESCRIPTION

Figure 2:
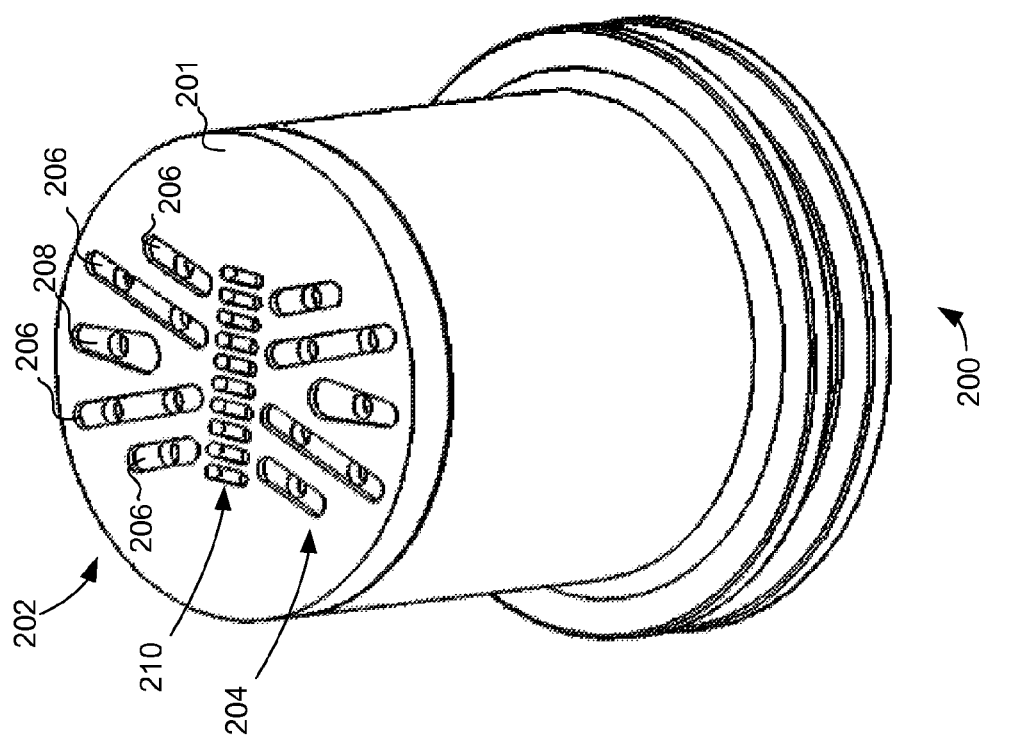
FIG. 2 is a perspective view of a die extractor base in accordance with an example embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Integrated circuits (ICs) are typically formed on a semiconductor wafer, such as silicon or gallium arsenide wafers. The formation of these ICs typically includes a variety of processes, including imaging, deposition, etching, and doping. In modern ICs each die can include numerous individual devices, including transistors, diodes, capacitors, inductors, and resistors. Additionally, each die can include the various connections between such devices, including multiple levels of wiring and various types of vertical interconnects. After fabrication of the IC the wafer is subsequently cut into individual pieces called "dies" using a wafer saw that does not typically cut the underlying adhesive tape. The dies are then separated from the adhesive tape. The separated dies can then be connected into packages that are typically formed of ceramic or plastic. Each die is connected into its corresponding package using bond wires or other types of connections that connect various elements on the IC to leads on the package, where the leads thus provide the external connections to the packaged IC. In modern ICs these leads can be in a variety of forms, including gull-wing leads, j-leads, pin grid arrays, ball grid arrays, and land grid arrays.

One issue in the fabrication and packaging of ICs is the presence of cracks on the die. Cracks can form on dies with a variety of structures, including fissures, fractures and/or other dislocation. Die cracks can be particularly problematic on modern ICs with relatively high densities and relatively high heat generation. Furthermore as dies become thinner they can become more susceptible to cracking the potential resulting failures. As described above, cracks can be formed on a die when it is separated from the adhesive tape. Specifically, using ejector pins to separate dies from the adhesive film can result in cracks, particularly where the dies are relatively thin and/or more brittle. For example, modern gallium arsenide dies can be both relatively thin and more brittle than traditional monocrystalline silicon dies, and as such are more prone to cracking when ejector pins are used. Such die fractures can result in lower yield for final packaged devices and/or lower long term reliability.

In accordance with the embodiments described herein, an apparatus and method for separating dies from adhesive tape are provided. In general, these techniques use applied vacuum and one or more channels in an extractor base surface to progressively peel adhesive tape away from the die. When the adhesive tape has been peeled away from the entire die the die can be removed and packaged. Such a technique can reduce the strain on the die and may reduce the probability of cracks forming in the die, and is thus particularly applicable to removing adhesive tape from dies that are relatively thin and/or brittle.

In one specific embodiment the extractor base surface is formed with at least two channels positioned in a non-parallel arrangement such that the spacing between channels narrows along a first direction. In this embodiment each of the two channels can be coupled to a vacuum source. The vacuum source and channels operate such that adhesive tape under a die passing over the surface along the first direction is progressively peeled away by the vacuum. Specifically, in such an embodiment the channels can be arranged such that the opposite outer edges of a die passing over the surface along the first direction encounter the channels to first start the progressive peeling away of the adhesive tape. As the die continues to move in the first direction the peeling continues, progressively moving toward the center of the die as the distance between channels narrows. Eventually the movement of the die over the channels causes the adhesive tape to be peeled away from the entire surface of the die. At this point, the die can be removed and packaged. Again, such a technique can reduce the probability of cracks being formed in the die during separation from the adhesive tape.

In other variations on these embodiments additional channels are formed in the surface. For example, a third channel can be formed between the two non-parallel channels. Additionally other pairs of channels can be provided. For example, channels can be provided to facilitate separation of dies moving in a direction different than the first direction.

Turning now to FIG. 1, top and cross-sectional views are illustrated of a die extractor base 100 in accordance with an example embodiment. These top and cross-sectional views show an exemplary die 102 at various different positions relative to the die extractor base 100. Also illustrated is adhesive tape 104. It should be noted that to provide a clear view of the die extractor base 100 the adhesive tape 104 is not shown in the top views. Also it should be noted although only one die 102 is illustrated, that in most applications multiple dies 102 would be attached to the adhesive tape 104. For example, in most cases the entire wafer of dies 102 is attached to the same adhesive tape 104. In such a case the extractor base 100 would be used to sequentially separate each of these dies 102 from the adhesive tape 104 by appropriately moving the separated wafer of dies 102 over the extractor base 100 until all of the dies 102 are separated.

In accordance with embodiments described herein, the die extractor base 100 includes a surface 106 in which a first channel 108 and a second channel 110 are formed. In this illustrated example the first channel 108 and the second channel 110 are positioned in a non-parallel arrangement such that the spacing between channels narrows along a first direction, with the first direction indicated by line 116. Also in this example each channel 108 and 110 are coupled to a vacuum source. Specifically, channel 108 is coupled to a vacuum source through opening 112 and channel 110 is coupled to a vacuum source through opening 114. In the die extractor base 100 the vacuum source and channels 108 and 110 operate such that the adhesive tape 104 is progressively peeled away from the die 102 as the die 102 moves across the surface 106 in the first direction.

FIGS. 1A and 1B illustrate the top view and a cross-sectional view of the die extractor base 100 and die 102, with the cross-sectional views taken along line AA. In FIG. 1A the die 102 has not yet encountered the first channel 108 of the second channel 110. In FIG. 1B the die 102 has moved along the first direction such that the opposite outer edges of the die 102 have encountered the channels 108 and 110 to start the progressive peeling away of the adhesive tape 104 from the die 102.

FIGS. 1C, 1D and 1E illustrate the cross-sectional views taken along line CC, DD, and EE respectively. In each of these figures the die 102 has moved further along the first direction indicated by line 116. As the die 102 moves in the first direction the distance between the first channel 108 and the second channel 110 narrows. This narrowing and the continued application of vacuum cause the progressive peeling of the adhesive tape 104 to continue as the die 102 moves in the first direction. Likewise, FIG. 1F illustrates the cross-sectional views taken along line FF. In FIG. 1F the die 102 has again moved further along the first direction indicated by line 116. At this point the channels 108 and 110 have come together, and the movement of the die 102 to this point has caused the adhesive tape 104 to have been progressively peeled away from the entire bottom surface of the die 102. Because the adhesive tape 104 has been peeled away from the entire bottom surface the die 102 can now be lifted from the adhesive tape 104.

While the illustrated embodiment shown in FIG. 1 includes just first and second channels 108 and 110, this is just one example implementation. For example, in other implementations a single channel in the surface 106 could be used. Conversely, in other implementations more channels could be used. Furthermore, openings in the surface with variety of other shapes could also be used, including circular shapes.

In one particular embodiment the die extractor base 100 could be implemented with an additional third channel and a fourth channel formed in the surface 106. In such an embodiment the third channel and the fourth channel can also be positioned in a non-parallel arrangement for progressively peeling away the adhesive tape. In one variation the third and fourth channels are positioned such that spacing between these channels also narrows along the first direction. In this embodiment the third and fourth channels are used with the first and second channels 108 and 110 to separate die 102 moving in the first direction. For example, by using the four channels concurrently to progressively peel the adhesive tape 104 from the die 102. Such an embodiment may provide more distributed vacuum pull to the adhesive tape 104, and thus may more effectively separate the die 102 from the adhesive tape 104. Additionally, when implemented with relatively narrow channels such an embodiment may provide additional support under the die 102 and thus reduce stress on the die 102 compared to using only two relatively wider channels.

In another variation the third and fourth channels are positioned such that spacing between channels widens along the first direction. In this embodiment the third and fourth channels can be used to separate dies 102 moving along a direction opposite the first direction. Thus, in this embodiment the die extractor base 100 can be used to separate dies 102 moving in multiple different directions across the surface 106, and such functionality may facilitate higher separation rates of dies 102 from an adhesive film 104. In another variation an additional channel can be added between the non-parallel first and second channels 108 and 110. Furthermore, it should be noted that these various and other various channels described above can be combined with other channels and shapes in other embodiments.

It should also be noted that in these various embodiments the adhesive film 104 may be separated from the die 102 without the use of ejector pins. Instead, only the vacuum is used to separate the adhesive tape. As described above, the use of ejector pins to push up dies 102 from the adhesive tape 104 can have several potential disadvantages. For example, while the use of ejector pins can be effective for separating for relatively thick dies 102, they can lead to cracking on relatively thin dies 102 or on dies that are relatively brittle.

In some embodiments it may be also desirable to provide a heating element configured to heat the surface 106 of the extractor base 100. Heating the surface 106 can soften the adhesive on the adhesive tape 104 and thus further facilitate the release of the adhesive tape 104 from the die 102. In such an embodiment the heating element could be positioned under the surface 106 and thermally coupled to the surface 106.

In the various embodiments described above the die 102 is moved over the surface 106 to separate the adhesive 104 from the die. Various different devices can be used to accomplish the movement of the die 102 over the surface 106. For example, an X-Y table configured to move the plurality of semiconductor dies 102 over the surface 106. In one specific embodiment the adhesive tape 104 with multiple dies 102 is mounted on a rigid frame and placed on an X-Y table that controls relative alignment of respective die 102 over the surface 106. The X-Y table can be controlled by a series of stepper motors, and thus can controllable move the dies over the surface 106 to facilitate progressive peeling of the dies 102 from the tape 104.

Finally, in some embodiments it may be desirable to provide one or more demount openings and/or support pillars configured to facilitate removal of the die 102. Such demount openings can be coupled to vacuum sources to hold the adhesive tape 104 while the die is picked up from the surface 106. In some embodiments support pillars are also provided to prevent undue stress on the die 102 during die pickup. As one example, demount openings separated by support pillars can be formed on the surface 106 at the final demount position. In such an embodiment vacuum could be applied through the demount openings at the final demount position to hold the adhesive tape 104 while a pick-up tool is used to grab and remove the die 102. In this case the support pillars between the demount openings would provide support under the die 102 to reduce the potential stress caused by the pick-up tool.

Turning now to FIG. 2, a perspective view of an extractor base 200 is illustrated. In this embodiment the extractor base 200 includes two sets of five channels formed on the surface 201, specifically, a first set of five channels 202 and a second set of five channels 204. These sets of five channels 202 and 204 are configured to separate dies moving in two different directions, with five channels 202 used to separate dies moving a first direction and five channels 204 used to separate dies moving in a second direction, opposite the first direction.

Each set of five channels 202 and 204 includes four channels 206 positioned in non-parallel arrangement such that the spacing between the four channels narrows along a direction of movement (i.e., the first direction and second direction). In the middle of these four channels is the fifth channel 208 arranged in the corresponding direction of movement. Each of these channels 206 and 208 are coupled to a vacuum source, and together the channels 206 and 208 operate such that adhesive tape under a die passing over the surface along the first direction is progressively peeled away by the vacuum. Specifically, in such an embodiment the channels 206 and 208 are arranged such that adhesive tape is progressively peeled away from a die passing over the surface 201 in the appropriate direction. Thus, as the die moves across the surface 201 peeling continues until the adhesive tape is peeled away from the entire surface of the die. It should be noted that in this illustrated embodiment the center channels 208 are formed to be thinner at a first end and wider at a second end. This shape also facilitates the progressively peeling away of the adhesive tape from the die.

In the center of the surface 201 is set of demount openings 210. The demount openings 210 are coupled to a vacuum source. These demount openings 210 are formed at the final demount position, i.e., after the end of the sets of channels 202 and 204. When a die reaches this demount position the adhesive tape has been peeled away the entire surface of the die and the die is ready to be picked up by a pick-up tool. The demount openings 210 at this demount position holds the adhesive tape while the die is picked up by the pickup tool. Support pillars between the demount openings 210 support the die and may reduce stresses that could occur on the die during this die pick up.

Turning now FIGS. 3A-3C, top views of the extractor base 200 are illustrated. Again, the extractor base 200 includes two sets five channels 202 and 204. The first set of channels 202 is arranged to separate dies moving in a first direction, while the second set of channels 204 is arranged to separate dies moving a second direction. FIG. 3B shows an example of set of dies 211 moving in the first direction across the surface 201, while FIG. 3C shows an example of a set of dies 212 moving in a second direction across the surface. Again, the first set of channels 202 are arranged to separate the first set of dies 211 moving in the first direction, and the second set of channels 204 are arranged to separate the second set of dies moving in the second direction. Because the extractor base 200 can be used to separate dies moving in both directions it may facilitate a relatively high rate of die separation.

Turning now to FIG. 4, a method 400 for separating dies from adhesive tape is illustrated. The step 402 is to provide an extractor base (e.g., extractor base 100) with non-parallel channels (e.g. channels 108 and 110) and vacuum openings (e.g., vacuum openings 112 and 114). As described above, such an extractor base can be implemented with channels in a non-parallel arrangement on the surface such that the spacing between channels narrowing along a first direction.

The step 404 is move a die across the table such the die encounters the non-parallel channels. As one example, the channels and motion are configured such that opposite outer edges of the die moving in the first direction encounters the channels. This can cause the progressively peeling away of the adhesive tape from the die to begin at the outer edges as the die encounters the channels.

The step 406 is continue moving the die across the surface in the direction that channel spacing narrows to progressively peel away the adhesive tape from the die. This motion across the surface combined with the application of vacuum causes the progressive peeling of the adhesive tape from the die. This motion and application of vacuum is continued until the adhesive tape has been progressively peeled away from the entire bottom surface of the die. For example, by continuing until the adhesive tape has been peeled away from the opposite outer edges to the center of the die.

The step 408 is to lift the die from the base. Because the adhesive tape has been previously peeled away from the entire bottom surface the die can now be easily lifted from the adhesive tape.

Thus, the method 400 facilitates the effective separation of the die from the adhesive tape without the potential stresses that could be caused by other methods. For example, without the stresses that could be caused by the use of ejector pins to push up the die from the tape. As such the method is particularly applicable to relatively thin or brittle dies that would otherwise be susceptible to cracking.

Certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An apparatus for separating a plurality of semiconductor dies from an adhesive tape, comprising:
   an extractor base having a surface for supporting the plurality of semiconductor dies attached to the adhesive tape, wherein the surface includes at least a first channel, the first channel including at least a first vacuum opening, the first channel arranged in the surface, wherein the extractor base further includes a second channel, the second channel including at least a second vacuum opening, the first channel and the second channel positioned in a non-parallel arrangement in the surface such that spacing between channels narrows along a first direction, and wherein the extractor base further includes a third channel in the surface, the third channel positioned between the first channel and the second channel.

2. The apparatus of claim 1 further comprising a vacuum source coupled to the first vacuum opening and the second vacuum opening such that the adhesive tape under a die passing over the surface along the first direction is progressively peeled away by the vacuum.

3. The apparatus of claim 1 further comprising a fourth channel and a fifth channel in the surface, wherein the fourth channel and the fifth channel are positioned in a non-parallel arrangement in the surface such that spacing between channels widens along the first direction.

4. The apparatus of claim 1 further comprising a fourth channel and a fifth channel in the surface, wherein the fourth channel and the fifth channel are positioned in a non-parallel arrangement in the surface such that spacing between channels narrows along the first direction.

5. The apparatus of claim 1 further comprising an X-Y table configured to move the plurality of semiconductor dies over the surface.

6. The apparatus of claim 1 further comprising a heating element configured to heat the surface of the extractor base.

7. The apparatus of claim 1 further comprising one or more demount openings in the surface configured to apply vacuum to the adhesive tape during die pickup.

8. The apparatus of claim 1 wherein the apparatus does not include an ejector pin for separating a die from the adhesive tape.

9. The apparatus of claim 1 wherein the adhesive tape is separated using only vacuum through the extractor base to pull the adhesive tape from the plurality of semiconductor dies.

10. An apparatus for separating a plurality of semiconductor dies from an adhesive tape, comprising:
    an extractor base having a surface for supporting the plurality of semiconductor dies attached to the adhesive tape, wherein the surface includes at least a first channel, a second channel, and a third channel, the first channel including at least a first vacuum opening and the second channel including at least a second vacuum opening, the first channel and the second channel positioned in a non-parallel arrangement in the surface such that spacing between channels narrows along a first direction, the third channel positioned between the first channel and the second channel, the first channel and the second channel further positioned such that a first outer edge of a die passing over the surface along the first direction encounters the first channel and a second outer edge opposite the first outer edge encounters the second channel; and
    a vacuum source coupled to the first vacuum opening and the second vacuum opening such that the adhesive tape under the die passing over the surface along the first direction is progressively peeled away by the vacuum.

11. A method for separating semiconductor dies from an adhesive tape, comprising:
    positioning a die on a surface of an extractor base, the surface supporting the die and the adhesive tape and including at least a first channel and a second channel, the first channel including at least a first vacuum opening and the second channel including at least a second vacuum opening, the first channel and the second channel positioned in a non-parallel arrangement in the surface such that spacing between channels narrows along a first direction;
    moving the die across the surface in the first direction such that a first outer edge of the die encounters the first channel and a second outer edge opposite the first outer edge encounters the second channel; and
    continuing to move the die across the surface in the first direction to progressively peel away the adhesive tape with vacuum applied to the first vacuum opening and the second vacuum opening.

12. The method of claim 11 wherein the step of moving the die comprising moving the die with an X-Y table.

13. The method of claim 11 wherein the surface further includes a third channel and a fourth channel, wherein the third channel and the fourth channel are positioned in a non-parallel arrangement in the surface such that spacing between channels widens along the first direction.

14. The method of claim 11 wherein the surface further comprises a third channel and a fourth channel in the surface, wherein the third channel and the fourth channel are positioned in a non-parallel arrangement in the surface such that spacing between channels narrows along the first direction.

15. The method of claim 11 further comprising heating the surface of the extractor base.

16. The method of claim 11 further comprising picking up the die while applying vacuum to the adhesive tape through one or more demount openings in the surface.

17. The method of claim 11 wherein the extractor base does not include an ejector pin for separating a die from the adhesive tape.

* * * * *